United States Patent [19]

Spielberger et al.

[11] Patent Number: 5,066,831
[45] Date of Patent: Nov. 19, 1991

[54] UNIVERSAL SEMICONDUCTOR CHIP PACKAGE

[75] Inventors: Richard K. Spielberger, Maple Grove; Thomas J. Dunaway, St. Louis Park, both of Minn.

[73] Assignee: Honeywell Inc., Minneapolis, Minn.

[21] Appl. No.: 421,364

[22] Filed: Oct. 13, 1989

Related U.S. Application Data

[63] Continuation-in-part of Ser. No. 112,851, Oct. 23, 1987, abandoned.

[51] Int. Cl.[5] .......................................... H01L 23/02
[52] U.S. Cl. ..................... 174/52.4; 357/74; 361/412; 361/414; 361/420
[58] Field of Search ............... 361/397, 412, 414, 419, 361/420; 357/74; 174/52.4, 68.5

[56] References Cited

U.S. PATENT DOCUMENTS

| | | |
|---|---|---|
| 3,519,959 | 7/1970 | Bewley et al. . |
| 4,190,901 | 2/1980 | Johnson et al. . |
| 4,407,007 | 9/1983 | Desai et al. . |
| 4,458,297 | 7/1984 | Stopper et al. . |
| 4,490,775 | 12/1984 | Quan . |
| 4,524,240 | 6/1985 | Stock et al. . |
| 4,543,646 | 9/1985 | Ambrosius, III et al. . |
| 4,551,789 | 11/1985 | Schettler et al. . |
| 4,557,540 | 12/1985 | Forbes et al. . |
| 4,609,241 | 9/1986 | Peterson . |
| 4,616,292 | 10/1986 | Sengoku et al. . |
| 4,620,264 | 11/1986 | Ushifusa et al. . |
| 4,652,065 | 3/1987 | Cassinelli . |
| 4,675,789 | 6/1987 | Kuwabara et al. . |
| 4,685,033 | 8/1987 | Inoue . |
| 4,736,521 | 4/1988 | Dohya . |
| 4,744,007 | 5/1988 | Watari et al. . |
| 4,754,371 | 6/1988 | Nitta et al. . |
| 4,764,644 | 8/1988 | Reisman et al. . |

OTHER PUBLICATIONS

Ecker et al., Semiconductor Package Structure, IBM Tech. Disc. Bull., v. 20, #8, Jan., 1979, pp. 3093 and 3.

*Primary Examiner*—Leo P. Picard
*Assistant Examiner*—Bot L. Ledynh
*Attorney, Agent, or Firm*—Gregory A. Bruns

[57] ABSTRACT

Disclosed is a semiconductor chip package comprising a plurality of programmable pads located on a surface of the package, each pad being adapted for interconnection with a semiconductor chip. The package also includes a plurality of signal connectors located on a surface of the package. In addition the package includes a plurality of signal connections, each signal connection providing an electrically conductive path between an individual programmable pad and a corresponding individual signal connector. A plurality of dedicated power or ground connectors are also located on a surface of the package. Conductive paths within the package provide apparatus for selectively connecting any programmable pad to a power or ground connector, any pad so connected also remaining connected to a corresponding signal connector.

14 Claims, 14 Drawing Sheets

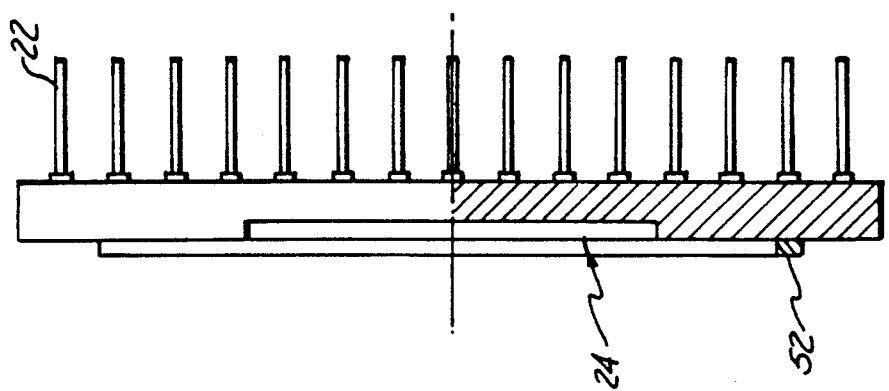
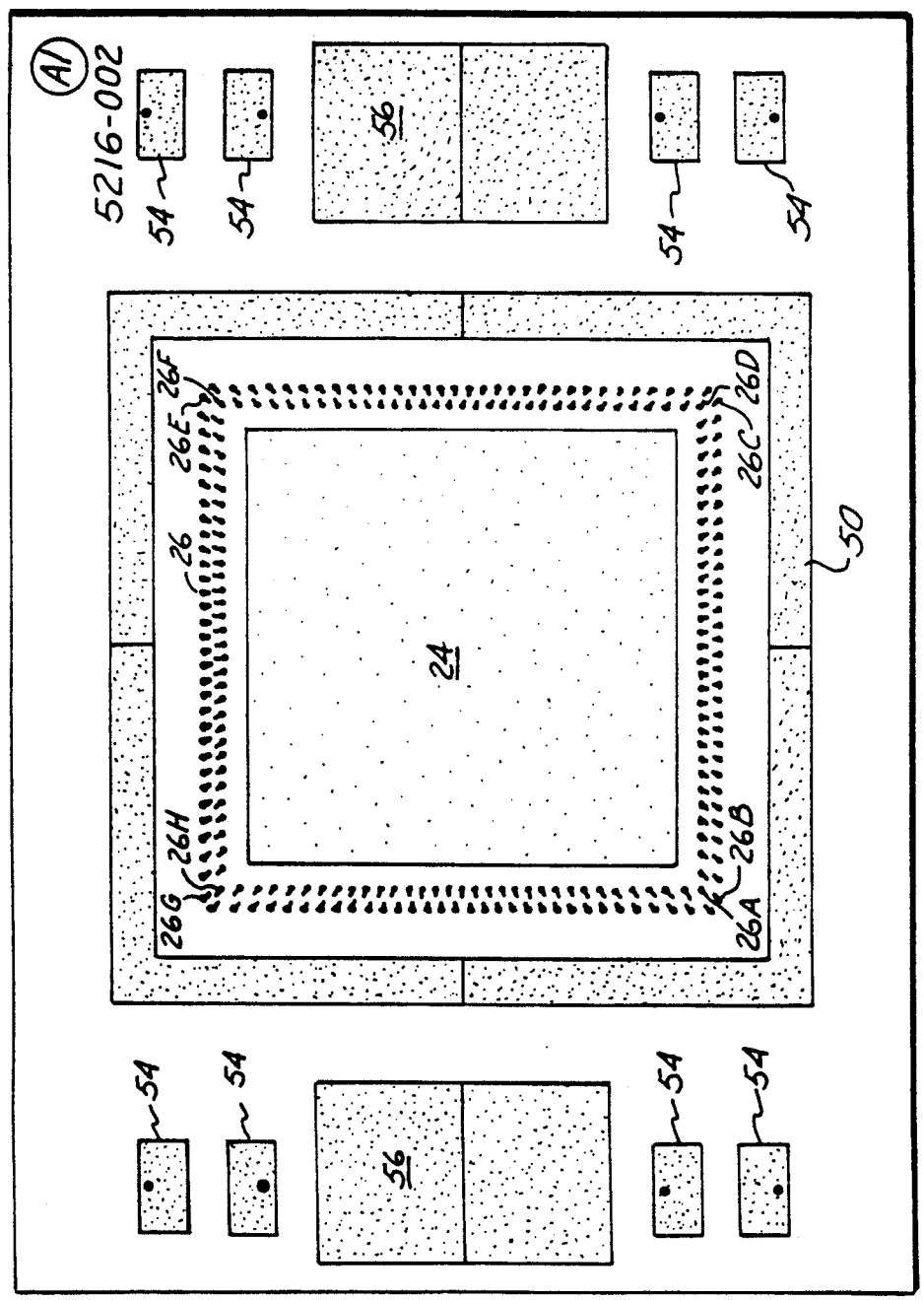
Fig. 1
Fig. 1A

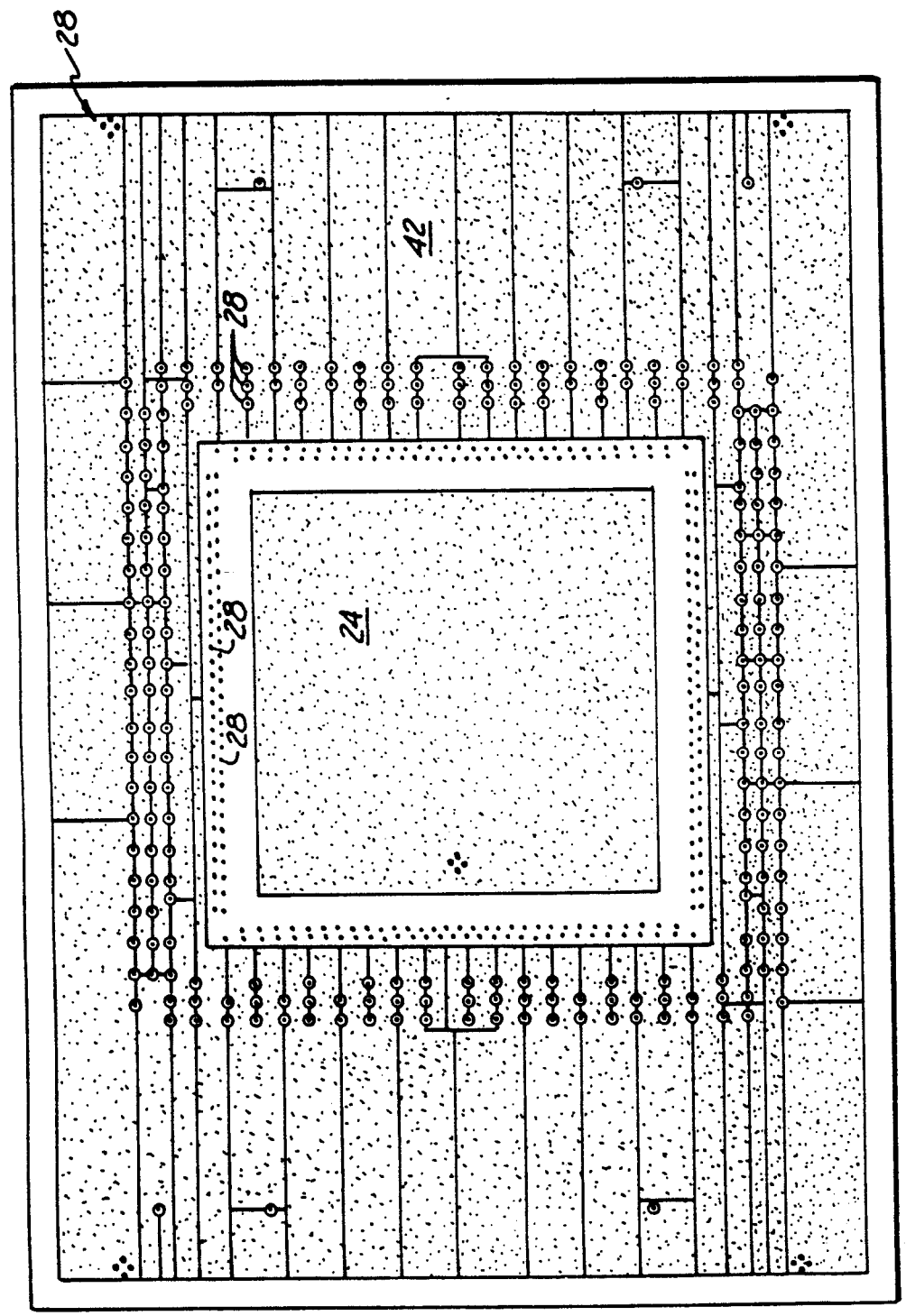

UNIVERSAL SEMICONDUCTOR CHIP PACKAGE

CROSS-REFERENCE TO RELATED APPLICATION

This application is a continuation-in-part of U.S. Application Ser. No. 07/112,851, filed Oct. 23, 1987, now abandoned.

BACKGROUND OF THE INVENTION

When a semiconductor chip is designed, it is quite common to find that there is no package available which is compatible with the chip for the purpose of interfacing the chip to a next level of packaging, e.g., to a printed circuit board. Accordingly, there are literally thousands of single-purpose semiconductor chip packages available; even in a 40 pin design, there are likely 60-80 variations available.

Fabricating specialized packages for each new chip design becomes expensive, particularly for chip designs having 200 to 300 pads, each requiring connection to the package for signal, power, or ground. Unless the chip is properly designed for a pre-existing package, connections by way of wire bonds or thermally activated bonding (TAB) connections cannot be made; in other words, if the chip has not been laid out so that direct connections from the edges of a chip can be made to corresponding signal, power or ground pads on the chip package, a special package must be designed and fabricated, resulting in present-day costs of $30,000 to $80,000 per chip package, typically $45,000 for a sophisticated package.

A significant problem with making the pads located on semiconductor chip packages available for handling either signal, power or ground is that special design considerations must be adhered to for power or ground paths that do not apply to signal paths. It is not uncommon in semiconductor chip packages for signal leads within the package to have relatively high resistance and inductance values, e.g., a total resistance on the order of 1 ohm and an inductance on the order of 2 nanohenries/cm; such signal path values are normally acceptable to the designers of most chips. On the other hand, most chip designers would like a relatively low resistance and inductance path between power and ground pads and corresponding next-level-of-packaging power or ground connectors. For example, many semiconductor chip package specifications require a resistance value of less than 0.1 ohm, and an inductance value in the picohenry range for power or ground paths is frequently desirable. Accordingly, it is normally not acceptable to simply use the electrical paths available through what are originally designed to be signal paths within a chip package for power or ground connections.

These problems are solved by a semi-conductor chip package comprising the present invention, which permits individual pads on the package to function either as signal, power or ground; in addition, this selectivity is accomplished in the first preferred embodiment while attaining a typical power and ground path having a resistance of less than 100 milliohms, typically 35-50 milliohms, and having an inductance of less than one nanohenry.

SUMMARY OF THE INVENTION

The present invention is a semiconductor chip package comprising a plurality of programmable pads located on a surface of the package, each pad being adapted for interconnection with a semiconductor chip. The package also includes a plurality of signal connectors located on a surface of the package. In addition, the package includes a plurality of signal connections, each signal connection providing an electrically conductive path between an individual programmable pad and a corresponding individual signal connector. A plurality of dedicated power or ground connectors are also located on a surface of the package. Conductive paths within the package provide apparatus for selectively connecting any programmable pad to a power or ground connector, any pad so connected also remaining connected to a corresponding signal connector.

BRIEF DESCRIPTION OF THE DRAWINGS

FIG. 1 illustrates the top layer of a first preferred embodiment.

FIG. 1A illustrates a typical cross sectional view of a semiconductor chip package comprising the present invention.

FIGS. 2-12 illustrate layers 2-12 of the first preferred embodiment.

DETAILED DESCRIPTION OF THE PREFERRED EMBODIMENTS

The semiconductor chip package disclosed here is a 269 pin grid array package. However, the concept of the present invention is applicable to other lead count packages as well to packages of designs other than pin grid arrays; for example, the present invention applies equally well to chip carriers.

Figure 12:
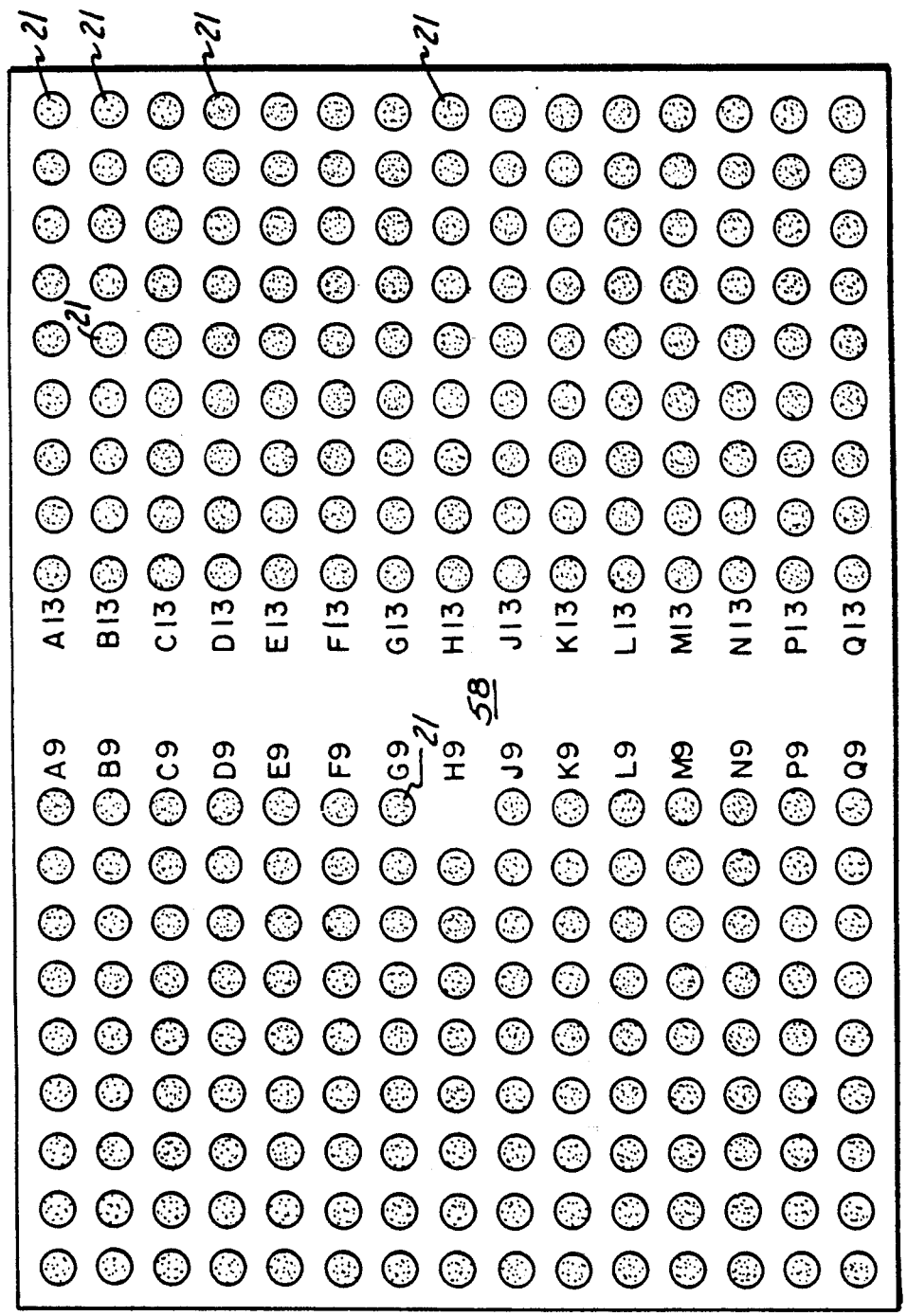

In one preferred embodiment (sometimes referred to as the first preferred embodiment), the present invention is implemented as shown in FIGS. 1-12, where FIG. 1 illustrates a top layer of the package and FIG. 12 illustrates a bottom layer of the package, the bottom of the package containing in the embodiment illustrated 269 pads 21, to which are connected 269 pins 22 (FIG. 1A) for use in connecting the package to another device such as to a next level of packaging, e.g., a printed circuit board.

Referring to FIGS. 1 and 1A, a semiconductor chip or die (not shown) containing signal, power or ground pads for connection to the present package is placed in die cavity or pad 24. The signal, power, or ground pads of the chip are typically connected by wire bonds or by TAB connections to programmable pads 26 which surround die cavity 24 on layer 1 as shown (pads 26 are typically configured as bond pads but could also be configured as flip-chip or any other pads used for chip-to-package interconnect). In the embodiment shown, there are 256 bond pads on layer 1 (FIG. 1), and these 256 pads can be used as explained below for either power or ground; however, as also explained below, 248 of the pads on layer 1 (all but 8, 2 in each corner) can also be used for signals.

Accordingly, 248 of the 256 pads 26 shown in FIG. 1 can be used for either signal, power, or ground in the first preferred embodiment, whether the 248 pads will be used for signal, power, or ground is determined by how layer 2 (FIG. 2) is configured, and this will be further explained below. The present package is preconfigured, however, so that all 248 pads which can be selectively used for either signal, power, or ground are preconnected with signal leads to 248 corresponding pins or other connectors 22 (FIG. 1A) located on a surface of the package. In other words, all pads 26 shown on layer 1 except for two pads in each corner (pads 26A-26F) are preconnected with signal paths from layer 1 down through vias 28 to either layer 6 or layer 9 (see FIGS. 6 and 9), through leads 30 on layers 6 and 9, and then down through further vias 28 to 248 corresponding connectors 22 located on a surface of the package.

This leaves 21 next-level-of-packaging connectors 22 which cannot be used for signals and which are dedicated to either power or ground. The manner in which power or ground is delivered to these dedicated connectors will be explained below.

The signal paths provided by the preconfigured connections from the 248 pads in layer 1 through the signal leads 30 in layers 6 and 9 to the corresponding 248 connectors 22 have a typical resistance on the order of one ohm and a typical inductance on the order of two nanohenries/cm; such resistance and inductance values are normally acceptable for providing signals to and from the semiconductor chip and the next-level-of-packaging connectors 22. However, as previously mentioned, for providing power or ground from semiconductor chip pads to connectors 22, a relatively low resistance and inductance is desired; most chip package specifications require a resistance for these connections of less than 0.1 ohm, and an inductance value in the picohenry range is typically desirable. Accordingly, it is not adequate to provide power or ground connections between pads 26 on layer 1 and connectors 22 at the bottom of other surface of the chip package through signal leads 30 of layers 6 and 9.

Achieving selectivity of the 248 programmable pads while at the same time meeting the low resistance and inductance path requirements for power and ground connections is implemented in the first preferred embodiment through power and ground pads 32 located in layer 2; (see FIG. 2); through power and ground rings or other metallizations such as rings 34-40 located in layer 3 (see FIG. 3); through four metal planes located in layers 4, 8, 10, and 11 (see FIGS. 4, 8, 10, and 11); through connector pins or other connectors 22 which are located at the bottom or other surface of the chip package and which are dedicated to power or ground; and through vias 28 connecting these elements between layers. Significantly, only layer 2 (FIG. 2) of the first preferred embodiment needs to be modified in order to convert one of the 248 programmable pads 26 from being a signal pad to being a power or ground pad. The remainder of the package remains standard. This single layer change for complete customization has previously been unavailable in the prior art.

Those skilled in the art will recognize that power and ground rings such as rings 34-40 shown in the first preferred embodiment in layer 3 (see FIG. 3) could also be of other configurations, such as power or ground bars 34A-40A (see FIG. 14) or that rings 34-40 could each be a large plurality of individual pads or other metallizations. In any event, the point is that power or ground rings 34-40 or power and ground bars 34A-40A shown in the first preferred embodiment of the present invention could as well be other metallization configurations. Thus, when power or ground rings or bars are referred to in the present application, it will be recognized by persons skilled in the art that these configurations could as well be other metallization configurations serving the same purpose.

In the first preferred embodiment, one power or ground pad 32 is configured in layer 2 (FIG. 2) for each pad 26 in layer 1 requiring a connection to power or ground. Each power or ground pad 32 in layer 2 is connected by a via 28 to a corresponding programmable pad 26 in layer 1 and by an additional via 28 (typically by several additional vias 28) to one of the four power or ground rings 34-40 below it in layer 3.

One each of these rings 34-40 in layer 3 is in turn connected by vias to one of four metal planes 42, 44, 46, or 48 contained in layers 4, 8, 10, and 11 (see FIGS. 4, 8, 10, and 11). These four metal planes are each connected to a portion of the dedicated power or ground connectors 22.

While less than four rings 34-40 and planes 42-48 could have been used (i.e., while some systems may require only a single power level and a single ground level), four rings and metal planes were designed into the present package in order to provide the ability to include two power levels for a semiconductor chip (e.g., to mix technologies such as CML and TTL requiring different voltages of, for example, 3.3 and 5.0 volts) as well as two ground levels.

Accordingly, using these elements of the first preferred embodiment, delivery of either power or ground through any of the 248 programmable pads 25 in layer 1 to power or ground connectors 22 at the bottom of the chip package is accomplished by designing power or ground pads 32 on layer 2 to extend horizontally from a via connection 28 located below a selected programmable pad 26 in layer 1 over to a location in layer 2 above the respective ring desired in layer 3 and by dropping vias 28 from the power or bond pad 32 in layer 2 down to the selected ring in layer 3. In the preferred embodiment shown, this extension and via connection makes a path of least resistance and inductance from the programmable pad 26 selected on layer 1, down a via 28 from the pad on layer 1 to the configured power or ground pad 32 in layer 2, down through vias 28 to a selected power or ground ring 34, 36, 38, or 40 in layer 3, down through vias 28 from the selected power or ground ring in layer 3 to a corresponding metal plane 42, 44, 46, or 48 below, through the metal plane, and down through vias 28 to the corresponding dedicated power or ground pins 22 (via corresponding pads 21 shown in layer 12) at the bottom of the semiconductor chip package. Through use of the relatively large area power or ground pads 32 in layer 2 and the metal planes corresponding to the power or ground pads 32 in layer 2 and the metal planes corresponding to the power or ground rings in layer 3, the desired path of relatively low resistance and inductance for power or ground is achieved.

Figure 2:
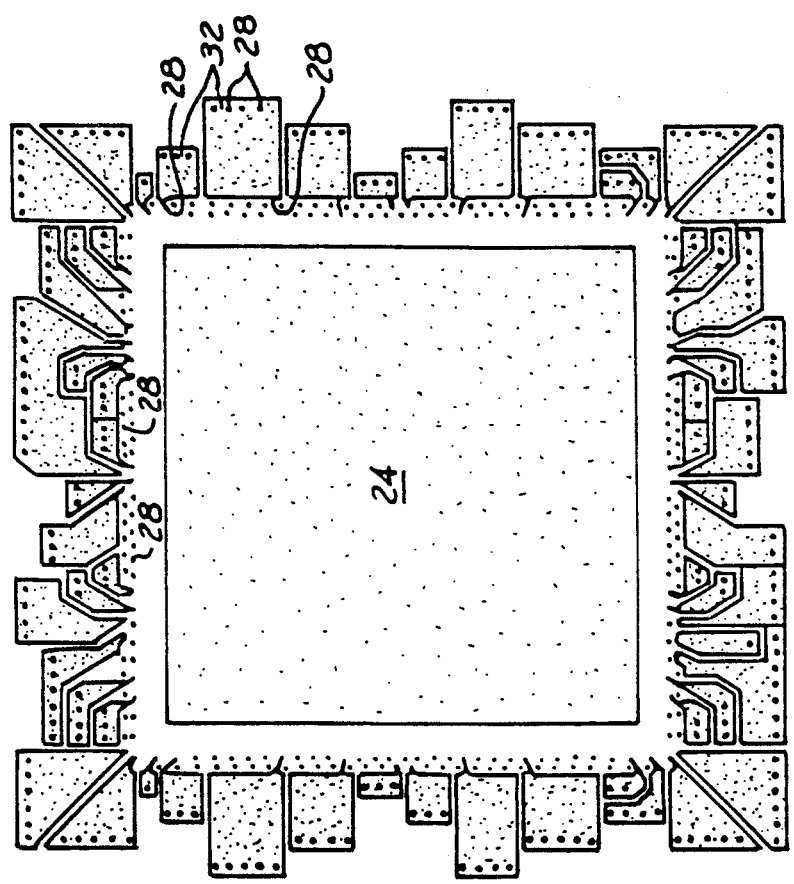
Figure 8:
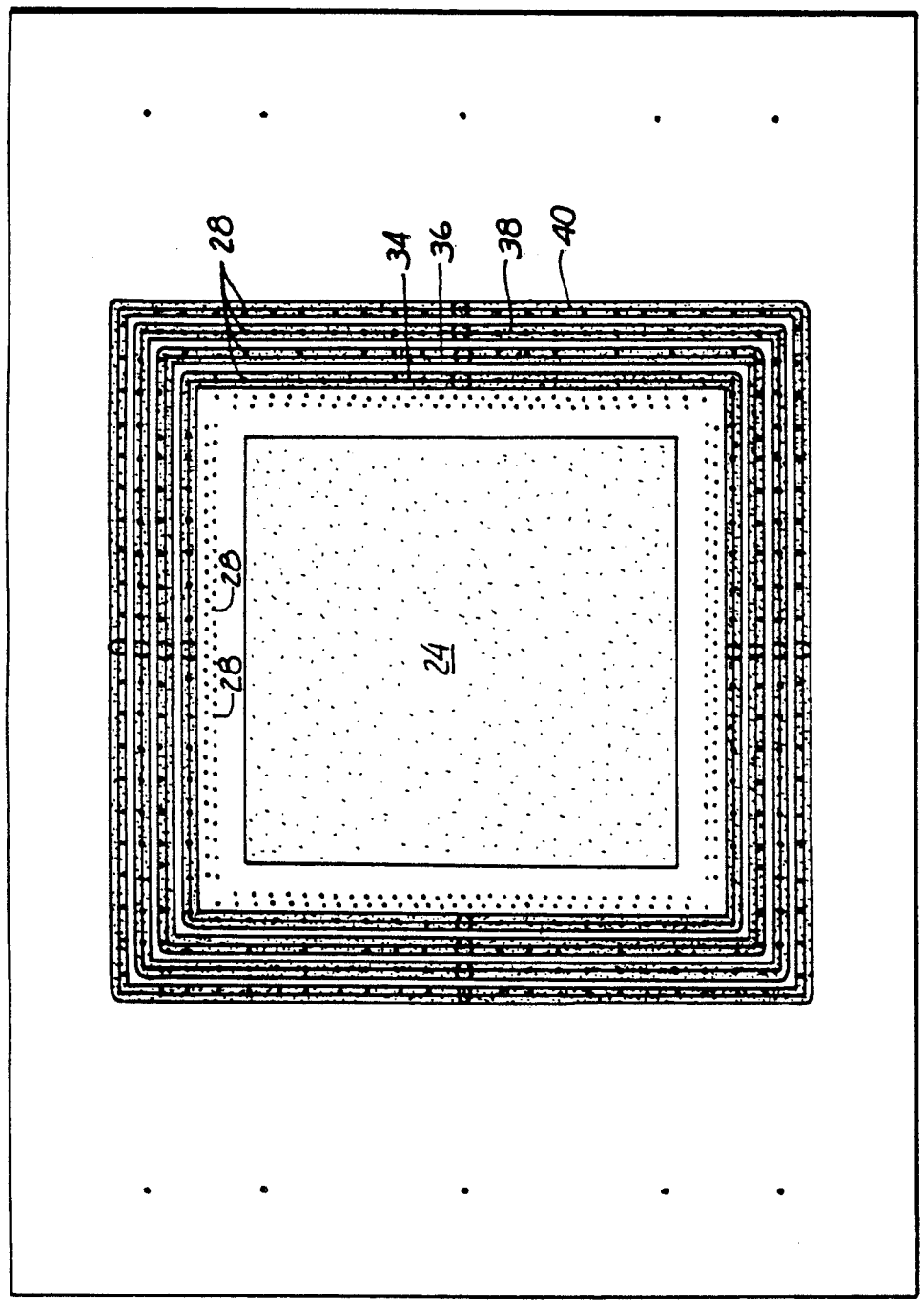
Figure 5:
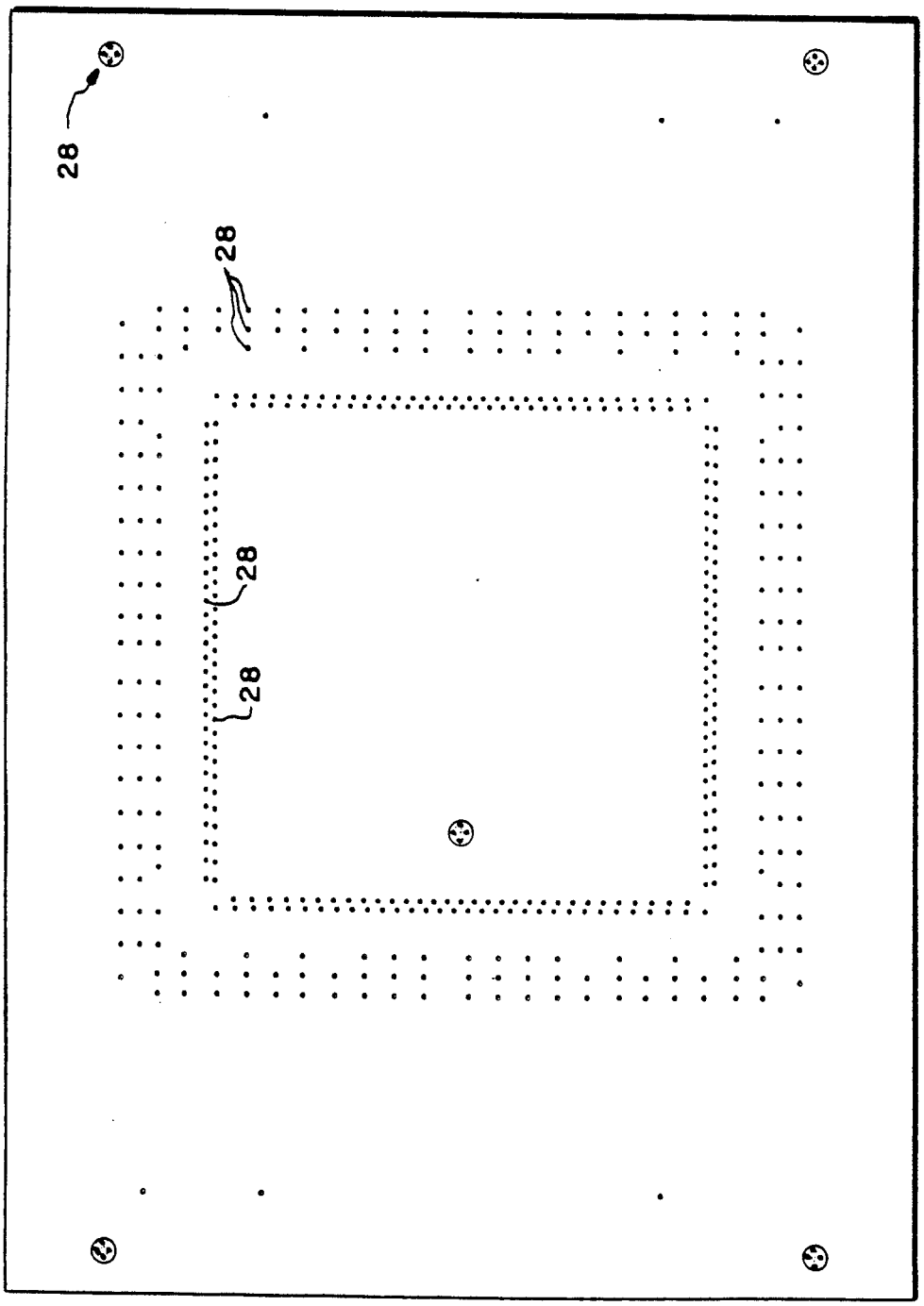
Figure 6:
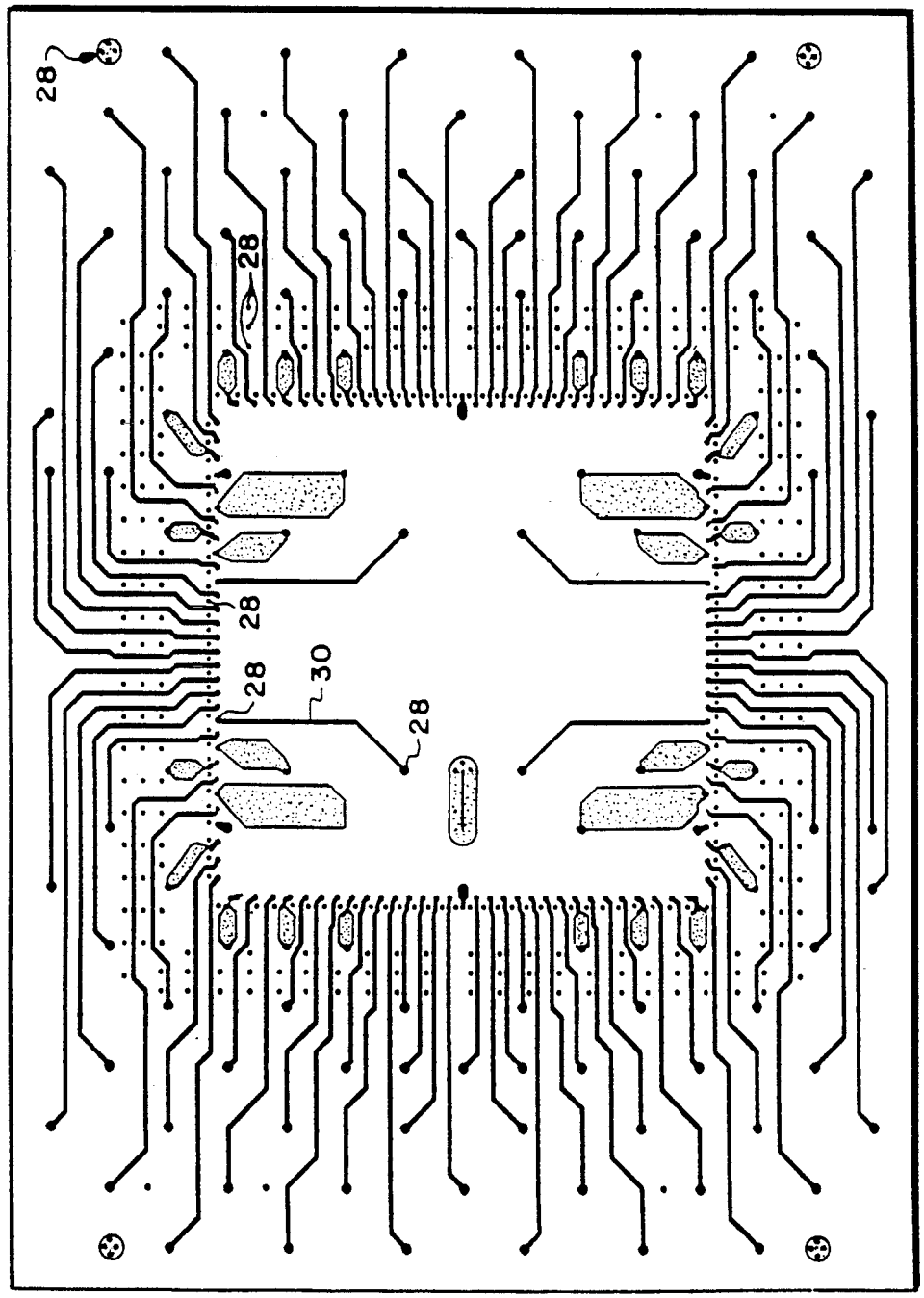
Figure 7:
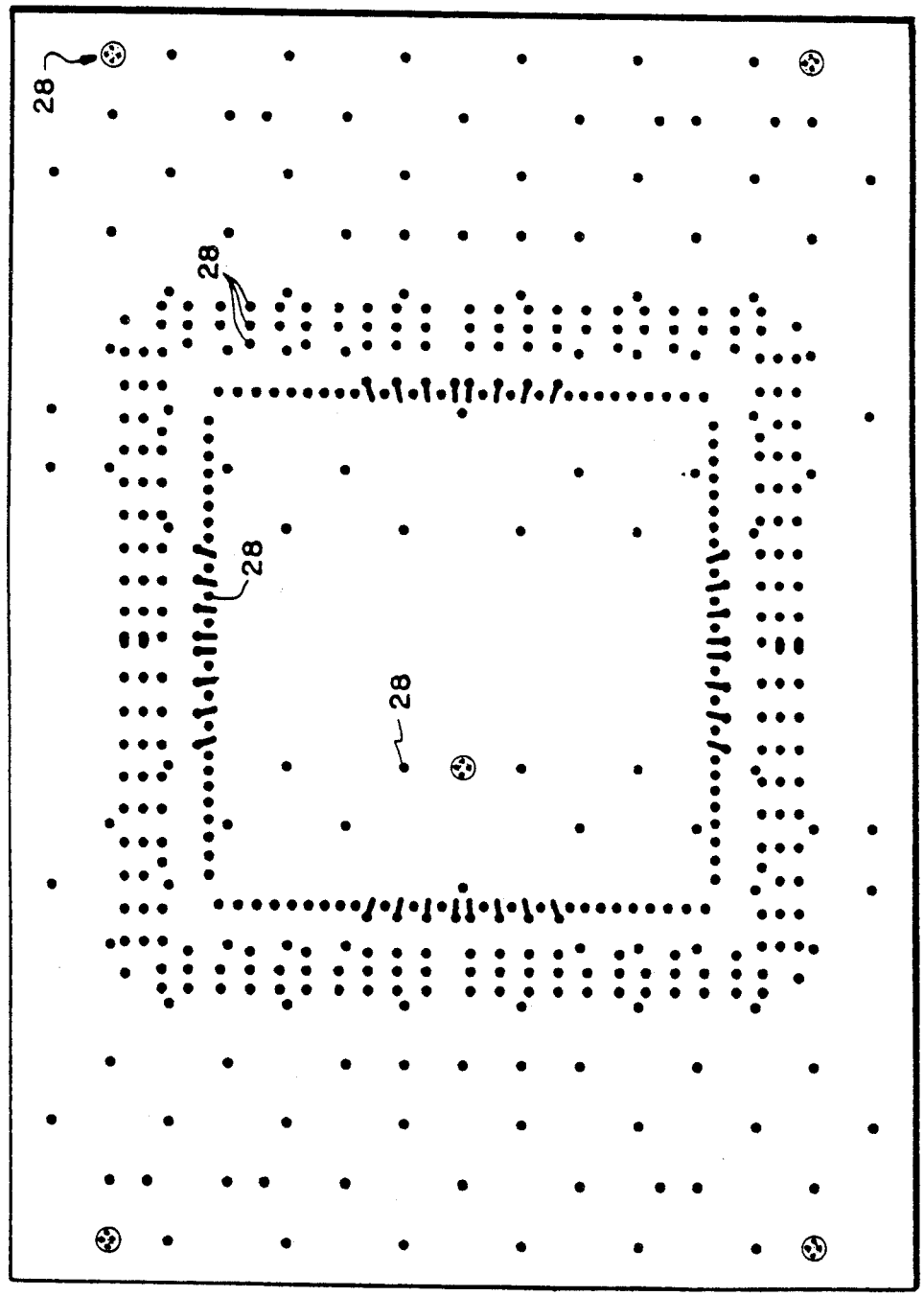
Figure 8:
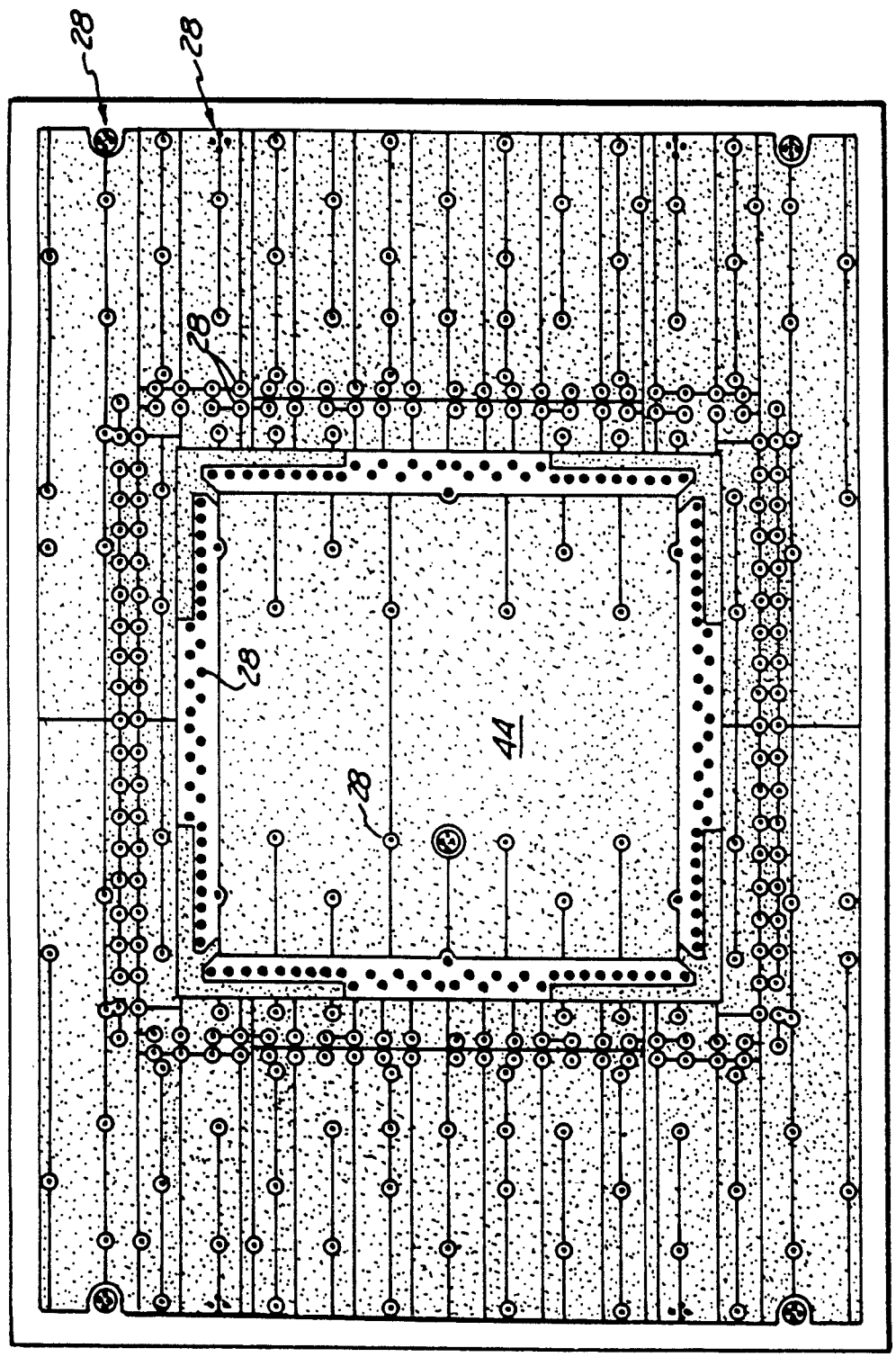
Figure 9:
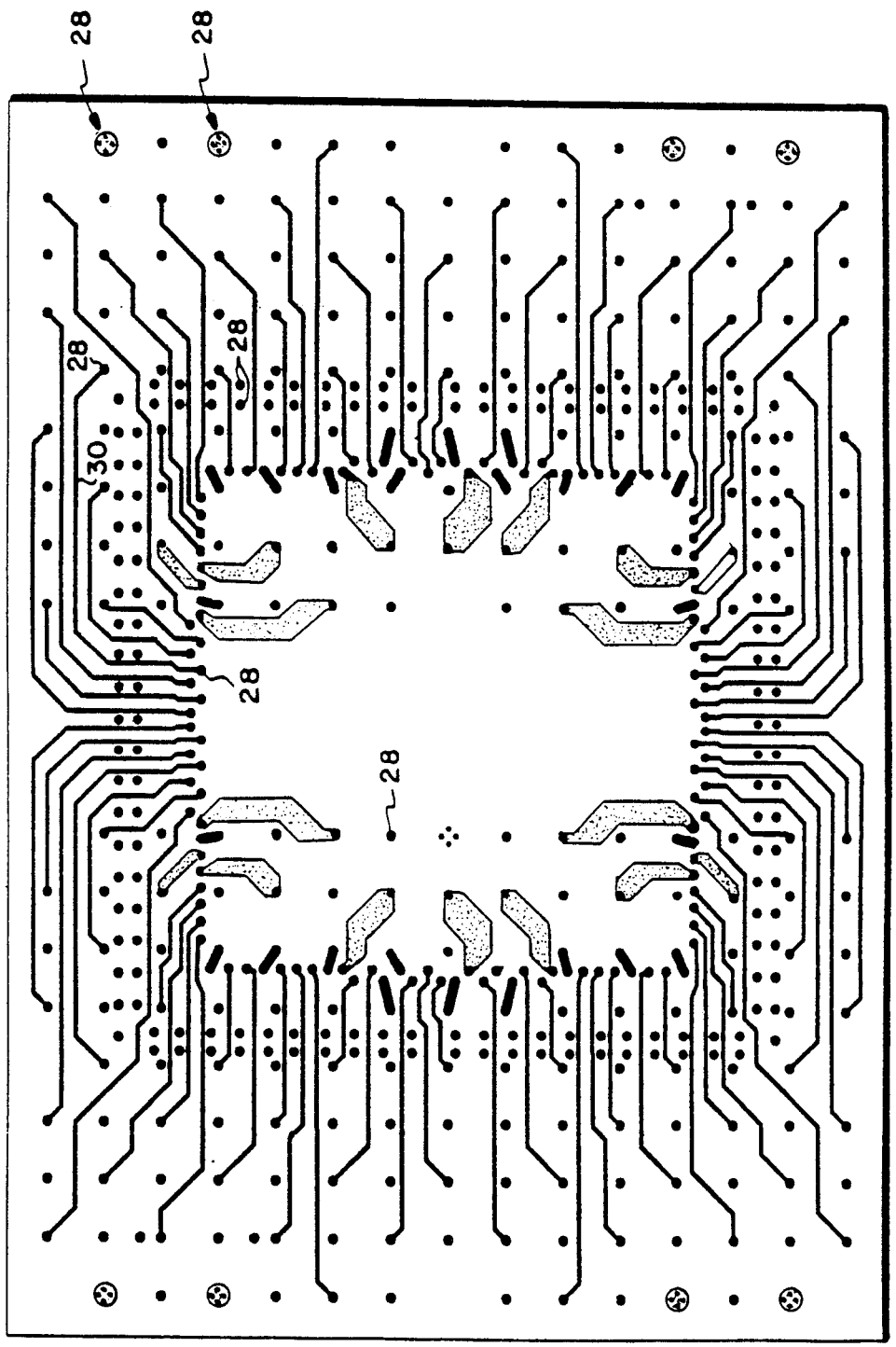
Figure 10:
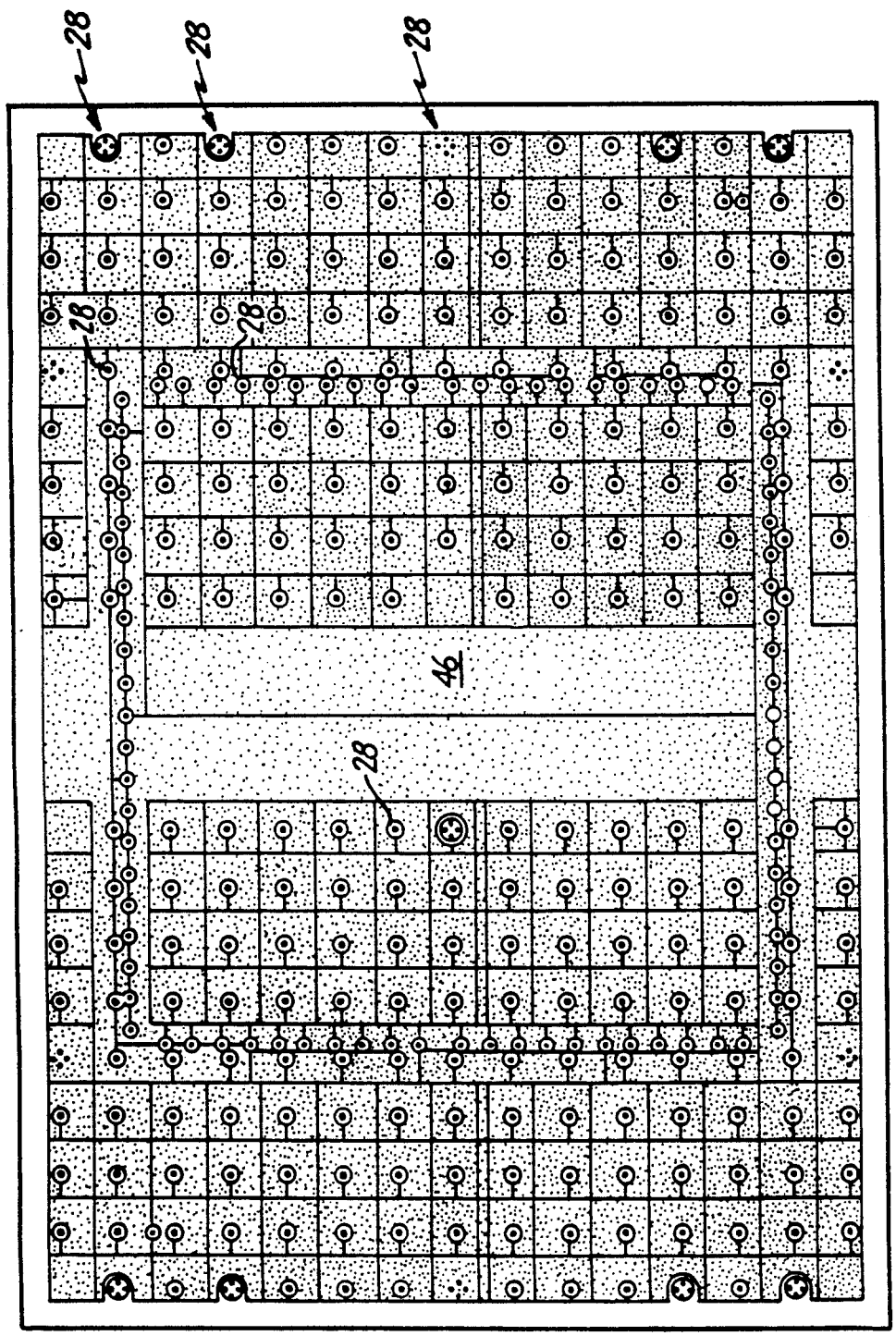
Figure 11:
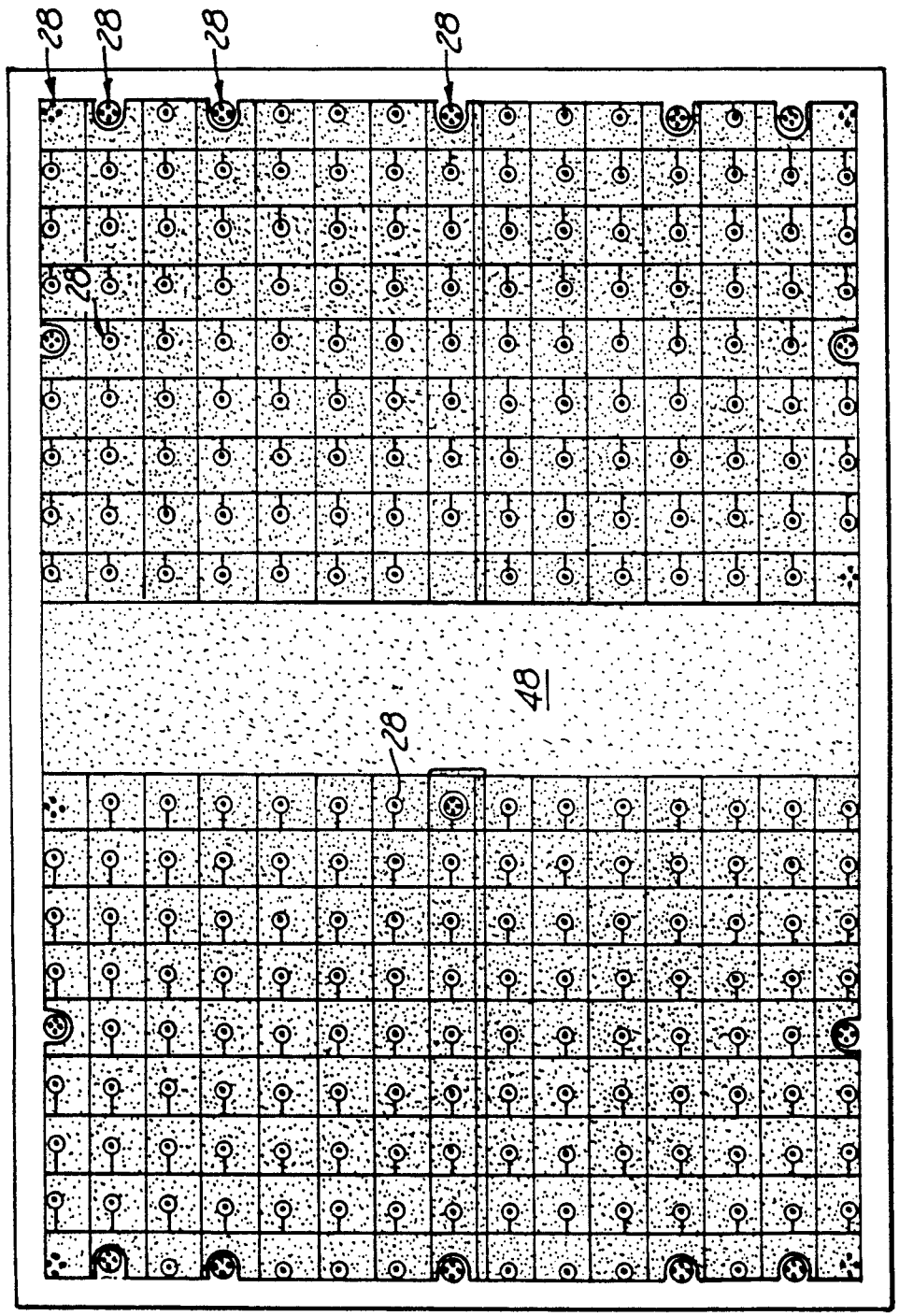

Accordingly, in the embodiment illustrated, the only layer that must be separately tooled for each different semiconductor chip is layer 2 (FIG. 2). The illustrative power or ground pads 32 shown in layer 2 total in number to 52; it can be seen that some of these pads are configured so that the vias connect to the innermost ring 34 in layer 3 and that other pads in layer 2 are selectively designed so that the vias extending below them connect to one of the other three rings in layer 3.

Layers 5 and 7 (FIGS. 5 and 7) serve primarily as spacers in the first preferred embodiment to obtain appropriate spacing between metal layers. In both layers 5 and 7, vias 28 continuing down from upper layers can be seen and, in layer 7, some via fanout is shown for compatibility with the requirements of a particular vendor.

In the first preferred embodiment as illustrated, the two pads in each corner of layer 1 (pads 26A-26G) are available only for power or ground. Each of these eight pads are connected to one of the four power or ground planes in layers 4, 8, 10, and 11 which, in turn, are each connected to a portion of the pins dedicated to power or ground. This approach to making these eight pins dedicated to power or ground would not have been necessary; however, it is frequently typical to have corner pads connected to power or ground.

In the first preferred embodiment, the bottom of cavity 24 comprises a metal plane 24 (FIG. 4), which is connected to a dedicated ground connector.

When programmable pads 26 are connected to dedicated power or ground connectors through the relatively low resistance, low impedance paths within the package, each pad so connected also remains connected to its corresponding signal connector. The useful power or ground path then becomes the low resistance low inductance path to the power or ground connector; the corresponding signal connector and power or ground connector may also be tied together in order to ensure that both connectors are tied to the appropriate power or ground.

Many of the details shown in the design of the first preferred embodiment are not necessary to the present invention. For example, pins 22 can be any type of connector compatible with an interfacing device, and connectors 22 can be located on any exterior surface desired. By way of another example, it would not have been necessary to use separate layers 1 and 2; in fact, in an alternate design, layers 1 and 2 are combined such that, in order to connect a layer 1 pad 26 to either power or ground, the pads 32 shown in layer 2 are instead simply configured onto layer 1, with vias 28 connecting each configured pad 32 with a selected ring below. The decision to use both layers 1 and 2 as shown was related primarily to cleaning up the appearance of the chip package; in the first preferred embodiment shown, the variable configuration of the selectively configured power or ground pads 32 is hidden in layer 2. Either configuration will work equally well, however.

An additional variation of the present invention has importance. In this variation (sometimes referred to as either the second or third preferred embodiment), the power and ground pads 32 of layer 2 are not used; instead, layer 2 is eliminated completely, and layers 1 and 3 are combined so that the top layer of the semiconductor chip package includes both pads 26 and power or ground rings 34, 36, 38, and 40 or other power ground metallizations. In one of these configurations, illustrated in FIG. 13 (the second preferred embodiment), chip pads to be connected to power or ground can be directly connected to a desired power or ground ring; alternately, converting a pad 26 to a power or ground connection requires only a direct connection between the appropriate ring and the pad 26 which is to be converted to power or ground. These connections can be made by wire bonds or by any appropriate means. This application of the second preferred embodiment requires an extra bond to be made for each pad 26 selected for use with power or ground; however, it totally eliminates the requirement for package tooling, which is required in the first preferred embodiment for configuring layer 2. Accordingly, this latter variation, in which layer 2 is eliminated and in which pads 26 and rings 34-40 are both put on the top layer, is particularly well suited for prototyping.

Figure 14:
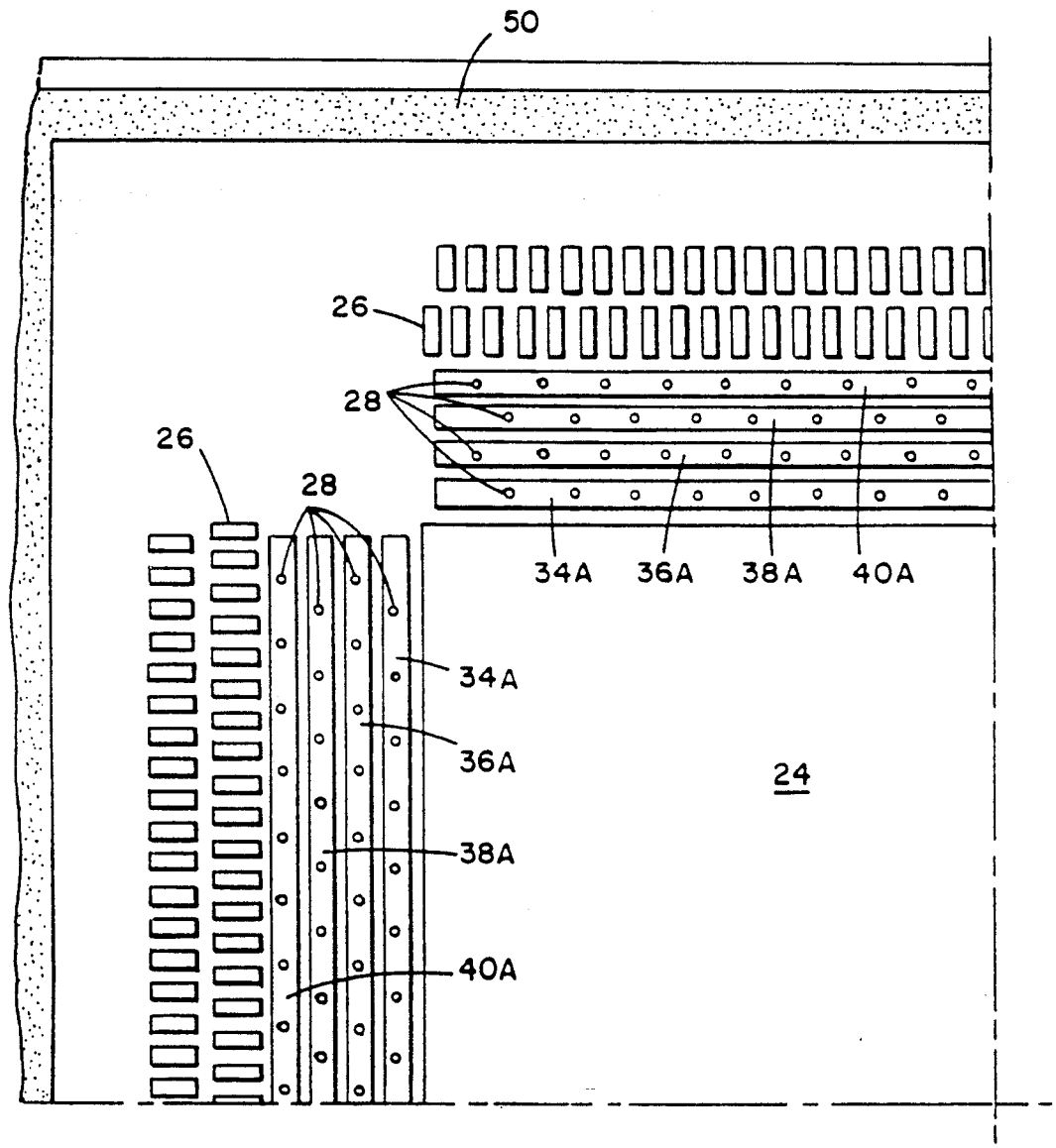
FIG. 14 illustrates the top layer of a further preferred embodiment.

The top layer of the third preferred embodiment is illustrated in FIG. 14. One difference between the third preferred embodiment and the other two disclosed embodiments is that power or ground bars 34A-40A are shown instead of the power or ground rings 34-40 employed in the other embodiments. However, as previously indicated, this difference is primarily one of showing a variation of power or ground metallization which can be used, those skilled in the art recognizing that power or ground bars 34A-40A can be structured to be functionally equivalent to power or ground rings 34-40. Further, as has previously been indicated, the power or ground bars or rings illustrated in the present embodiments could also be implemented through other metallization configurations, e.g., each power or ground ring or bar could be configured as a plurality of smaller metallizations connected to a particular power or ground plane.

Figure 13:
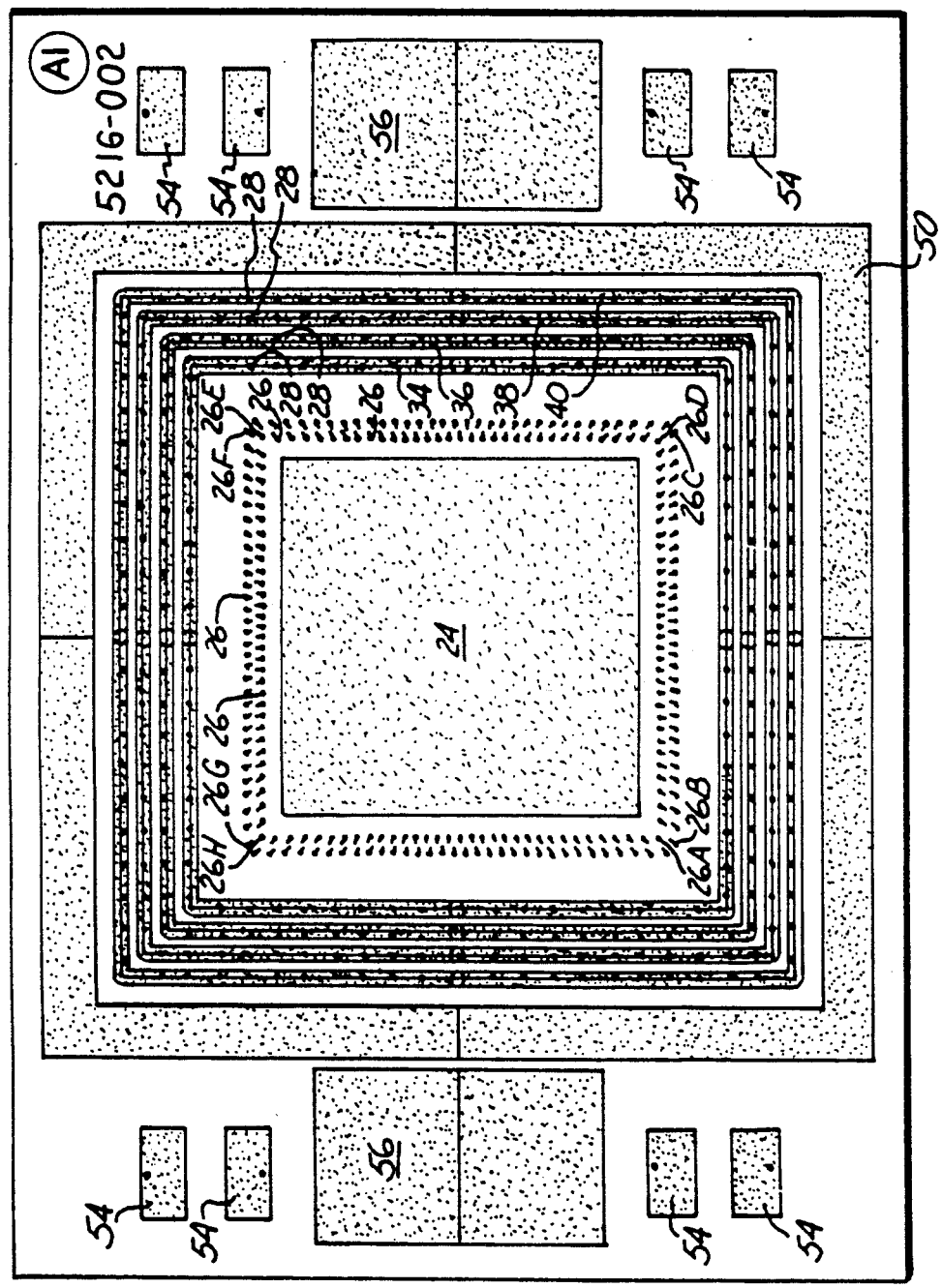
FIG. 13 illustrates the top layer of an alternate preferred embodiment.

Perhaps more significantly, the third preferred embodiment is shown differing from the second preferred embodiment in that pads 26 are adjacent chip cavity or pad 24 in the FIG. 13 second preferred embodiment, with power or ground rings or other metallizations 34-40 located further away from chip pad 24 in that embodiment. Conversely, power or ground bars or other metallizations 34A-40A in the FIG. 14 third preferred embodiment are shown more close to chip pad 24 than pads 26 in that embodiment. Accordingly, the FIG. 14 or third preferred embodiment may have an advantage over the FIG. 13 or second preferred embodiment by having a shorter connection distance between chip pads and the corresponding power or ground metallizations. Those skilled in the art will recognize, however, that a functional package would also result with pads 26 and power or ground metallizations intermixed rather than being grouped as shown in the figures.

In the embodiments of FIGS. 13 and 14, pads 26 could be referred to as selectively-addressable signal pads, since corresponding pads of a semiconductor chip resident on chip pad 24 can be selectively addressed or connected to selected individual signal pads 26. Accordingly, the present invention in accordance with the second and third embodiments may be described as a semiconductor chip package comprising a chip pad 24 for receiving a semiconductor chip. The package further comprises a plurality of selectively-addressable signal pads 26. As is indicated in FIGS. 13 an 14, the selectively-addressable signal pads are located on a surface of a semiconductor chip package. Each signal pad 26 is selectively connectable to a semiconductor chip signal pad.

The package in accordance with the second or third preferred embodiment further comprises a plurality of signal connectors such as 22 (FIG. 1A) located on a surface of the package. Also provided are a plurality of signal connections, each signal connection providing an electrically conductive path between an individual selectively-addressable signal pad 26 and a corresponding individual signal connector such as 22. These signal paths may comprise vias 28 and leads 30 (see FIGS. 6 and 9) connected between the selectively-addressable pads 26 and the connector pins or other connectors 22 located on the bottom or other surface of the chip package.

A plurality of selectively-addressable power or ground metallizations such as rings 34-40 or bars 34A-40A are located on a surface of the package, each power or ground metallization being selectively connectable to a semiconductor chip power or ground pad. As has been indicated previously, those skilled in the art will recognize that power or ground rings 34-40 and power or ground bars 34A-40A can be replaced by other power or ground metallization configurations.

The present invention in accordance with the second and third preferred embodiments further comprises a plurality of power or ground connectors such as connector pins or other connectors 22 located on a surface of the package as well as a plurality of power or ground connections, each power or ground connection providing an electrically conductive path between an individual selectively-addressable power or ground metallization and a corresponding individual power or ground connector. The resistance and inductance values of the electrically conductive path from each selectively addressable power or ground metallization to a corresponding power or ground connector is substantially less than the resistance and inductance values of the electrically conductive path from each selectively addressable signal pad to a corresponding signal connector. These power or ground connections may comprise metal planes (e.g., such as the planes shown in layers 4, 8, 10 and 11 (see FIGS. 4, 8, 10 and 11) and vias 28 which interconnect the power or ground metallizations, the metal planes, and the connector pins or other connectors 22 located at the bottom or other surface of the chip package.

The drawings illustrate a variety of additional features of the preferred embodiments, including a site 50 on which to mount a seal ring 52 for attaching a cover. In addition, layer 1 in FIGS. 1 and 13 includes two large laser marking pads 56 and sites 54 for attaching capacitors for decoupling between planes. A central path 58 for heat removal is also shown on bottom layer 12 (FIG. 12). In the preferred embodiments, each layer is electrically insulated from adjacent layers by ceramic layers, typically 0.015 inch in thickness, the corresponding features of each layer being interconnected for electrical conduction only by vias 28.

The present invention is to be limited only in accordance with the scope of the appended claims, since persons skilled in the art may devise other embodiments still within the limits of the claims.

The embodiments of the invention in which an exclusive property or right is claimed are defined as follows:

1. A semiconductor chip package, comprising:
   a plurality of programmable pads located on a surface of a semiconductor chip package, each pad being adapted for interconnection with a semiconductor chip;
   a plurality of signal connectors located on a surface of the package;
   a plurality of signal connections, each signal connection providing an electrically conductive path between an individual programmable pad and a corresponding individual signal connector;
   a plurality of dedicated power or ground connectors located on a surface of the package; and
   connection means comprising electrically conductive paths within the package for selectively connecting any programmable pad to a dedicated power or ground connector, any programmable pad so connected also remaining connected to a corresponding signal connector.

2. The apparatus of claim 1 wherein the resistance and inductance values of the electrically conductive path from each programmable pad to a corresponding dedicated power or ground connector is substantially less than the resistance and inductance values of the electrically conductive path from the same programmable pad to a corresponding signal connector.

3. The apparatus of claim 1 wherein:
   the plurality of signal connections comprises a plurality of signal leads configured on a signal lead layer located within the package; and
   the connection means comprises:
   first and second power or ground metallizations; and
   first and second power or ground planes, the first power or ground plane being connected for electrical conduction with the first power or ground metallizations, the second power or ground plane being connected for electrical conduction with the second power or ground metallizations, each dedicated power or ground connector being connected for electrical conduction with one of the first or second power or ground planes.

4. The apparatus of claim 3 wherein the resistance and inductance values of the electrically conductive path from each programmable pad to a corresponding dedicated power or ground connector is substantially less than the resistance and inductance values of the electrically conductive path from the same programmable pad to a corresponding signal conductor.

5. The apparatus of claim 3 wherein the connection means comprises power or ground pad connection means for connecting selected programmable pads to one of the power or ground metallizations and for connecting other programmable pads to the other power or ground metallization, the power or ground pad connection means comprising a plurality of power or ground pads located in a single layer, each power or ground pad being configured and located for an electrically conductive connection between one selected programmable pad and one of the power or ground metallizations.

6. The apparatus of claim 5 wherein the resistance and inductance values of the electrically conductive path from each programmable pad to a corresponding dedicated power or ground connector is substantially less than the resistance and inductance values of the electrically conductive path from the same programmable pad to a corresponding signal connector.

7. The apparatus of claim 5 wherein:
   the power or ground metallizations are located in a layer within the package;
   the layer of power or ground pads is located within the package; and
   the power or ground pad connection means comprises vias which provide electrically conductive paths between each power or ground pad, a corresponding programmable pad, and a corresponding power or ground metallization.

8. The apparatus of claim 7 wherein the resistance and inductance values of the electrically conductive path from each programmable pad to a corresponding dedicated power or ground connector is substantially less than the resistance and inductance values of the electrically conductive path from the same programmable pad to a corresponding signal connector.

9. The apparatus of claim 3 wherein:
the power or ground metallizations are located on a surface of the package on which the programmable pads are located.

10. The apparatus of claim 9 wherein the resistance and inductance values of the electrically conductive path from each programmable pad to a corresponding dedicated power or ground connector is substantially less than the resistance and inductance values of the electrically conductive path from the same programmable pad to a corresponding signal connector.

11. A semiconductor chip package, comprising:
a plurality of programmable pads located on a surface of the package;
a plurality of signal leads configured on a signal lead layer located within the package;
a plurality of signal lead vias, each signal lead via being connected for electrical conduction between one of programmable pads and a predetermined signal lead located in the signal lead layer;
a plurality of signal connectors located on a surface of the package;
a plurality of signal connector vias, each signal connector via being connected for electrical conduction between one of the signal leads and a predetermined signal connector;
first and second power or ground metallizations located in a layer within the package;
a plurality of power or ground pads located in a layer within the package, each power or ground pad being configured and located for connection by vias with one selected programmable pad and one of the power or ground metallizations;
a plurality of power or ground pad vias, there being at least one power or ground pad via connected for electrical conduction between each individual power or ground pad and a corresponding individual programmable pad;
a plurality of power or ground metallization vias, there being at least one power or ground metallization via connected for electrical conduction between each individual power or ground metallization;
first and second power or ground planes located within the package;
a first power or ground plane via connected for electrical conduction between the first power or ground metallization and the first power or ground plane;
a second power or ground plane via connected for electrical conduction between the second power or ground metallization and the second power or ground plane;
a plurality of dedicated power or ground connectors located on a surface of the package; and
a plurality of power or ground connector vias, there being at least one power or ground connector via connected for electrical conduction between each individual dedicated power or ground connector and one of the first or second power or ground planes;
the resistance and inductance values of the electrically conductive path from each programmable pad connected for use with power or ground to a corresponding dedicated power or ground connector being substantially less than the resistance and inductance values of the electrically conductive path from the same programmable pad to a corresponding signal connector.

12. A semiconductor chip package, comprising:
a plurality of programmable pads located on a surface of the package;
a plurality of signal leads configured on a signal lead layer located within the package;
a plurality of signal lead vias, each signal lead via being connected for electrical conduction between one of the programmable pads and a predetermined signal lead located in the signal lead layer;
a plurality of signal connectors located on a surface of the package;
a plurality of signal connector vias, each signal connector via being connected for electrical conduction between one of the signal leads and a predetermined signal connector;
first and second power or ground metallizations located on a surface of the package;
first and second power or ground planes located within the package;
a first power or ground plane via connected for electrical conduction between the first power or ground metallization and the first power or ground plane;
a second power or ground plane via connected for electrical conduction between the second power or ground metallization and the second power or ground plane;
a plurality of dedicated power or ground connectors located on a surface of the package; and
a plurality of power or ground connector vias, there being at least one power or ground connector via connected for electrical conduction between each individual dedicated power or ground connector and one of the first or second power or ground planes;
the resistance and inductance values of the electrically conductive path from each power or ground metallization to a corresponding dedicated power or ground connector being substantially less than the resistance and inductance values of the electrically conductive path from an individual programmable pad to a corresponding signal connector.

13. A semiconductor chip package, comprising:
a plurality of programmable pads located on a surface of the package;
a plurality of signal leads configured on a signal lead layer located within the package;
a plurality of signal lead vias, each signal lead via being connected for electrical conduction between one of the programmable pads and a predetermined signal lead located in the signal lead layer;
a plurality of signal connectors located on a surface of the package;
a plurality of signal connector vias, each signal connector via being connected for electrical conduction between one of the signal leads and a predetermined signal connector;
first, second, third, and fourth power or ground metallizations located in a layer within the package;
a plurality of power or ground pads located in a layer within the package, each power or ground pad being configured and located for connection by vias with one selected programmable pad and one of the power or ground metallizations;
a plurality of power or ground pad vias, there being at least one power or ground pad via connected for electrical conduction between each individual power or ground pad and a corresponding individual programmable pad;

a plurality of power or ground metallization vias, there being at least one power or ground metallization via connected for electrical conduction between each individual power or ground pad and a corresponding individual power or ground metallization;

first, second, third, and a fourth power or ground planes located within the package;

a first power or ground plane via connected for electrical conduction between the first power or ground metallization and the first power or ground plane;

a second power or ground plane via connected for electrical conduction between the second power or ground metallization and the second power or ground plane;

a third power or ground plane via connected for electrical conduction between the third power or ground metallization and the third power or ground plane;

a fourth power or ground plane via connected for electrical conduction between the fourth power or ground metallization and the fourth power or ground plane;

a plurality of dedicated power or ground connectors located on a surface of the package and;

a plurality of power or ground connector via there being at least one power or ground connector via connected for electrical conduction between individual dedicated power or ground connector and one of the first, second, third, or fourth power or ground planes;

the resistance and inductance values of the electrically conductive path from each programmable pad connected for use with power or ground to a corresponding dedicated power or ground connector being substantially less than the resistance and inductance values of the electrically conductive path from the same programmable pad to a corresponding signal connector.

14. A semiconductor chip package, comprising:

a plurality of programmable pads located on a surface of the package;

a plurality of signal leads configured on a signal lead layer located within the package;

a plurality of signal lead vias, each signal lead via being connected for electrical conduction between one of the programmable pads and a predetermined signal lead located in the signal lead layer;

a plurality of signal connectors located on a surface of the package;

a plurality of signal connector vias, each signal connector via being connected for electrical conduction between one of the signal leads and a predetermined signal connector;

first, second, third, and fourth power or ground metallizations located on a surface of the package;

first, second, third, and fourth power or ground planes located within the package;

a first power or ground plane via connected for electrical conduction between the first power or ground metallization and the second power or ground plane;

a second power or ground plane via connected for electrical conduction between the first power or ground metallization and the second power or ground plane;

a third power or ground plane via connected for electrical conduction between the third power or ground metallization and the third power or ground plane;

a fourth power or ground plane via connected for electrical conduction between the fourth power or ground plane;

a plurality of dedicated power or ground connectors located on a surface of the package and;

a plurality of power or ground connector vias, there being at least one power or ground connector via connected for electrical conduction between each individual dedicated power or ground connector and one of the first, second, third, or fourth power or ground planes;

the resistance and inductance values of the electrically conductive path from each power or ground metallization to a corresponding dedicated power or ground connector being substantially less than the resistance and inductance values of the electrically conductive path from an individual programmable pad to a corresponding signal connector.

* * * * *